(12) United States Patent
Guha et al.

(10) Patent No.: US 6,875,914 B2
(45) Date of Patent: Apr. 5, 2005

(54) PHOTOVOLTAIC ROOFING STRUCTURE

(75) Inventors: Subhendu Guha, Bloomfield Hills, MI (US); Tim Ellison, Royal Oak, MI (US)

(73) Assignee: United Solar Systems Corporation, Auburn Hills, MI (US)

( * ) Notice: Subject to any disclaimer, the term of this patent is extended or adjusted under 35 U.S.C. 154(b) by 0 days.

(21) Appl. No.: 10/341,263

(22) Filed: Jan. 13, 2003

(65) Prior Publication Data

US 2003/0217768 A1 Nov. 27, 2003

Related U.S. Application Data

(60) Provisional application No. 60/348,681, filed on Jan. 14, 2002.

(51) Int. Cl.[7] .................... H01L 31/048; H01L 31/05
(52) U.S. Cl. .................... 136/251; 136/244; 136/291; 52/173.3; 257/433
(58) Field of Search ................. 136/251, 244, 136/291; 52/173.3; 257/433

(56) References Cited

U.S. PATENT DOCUMENTS

| | | | |
|---|---|---|---|
| 4,617,420 A | * 10/1986 | Dilts et al. .............. 136/244 |
| 5,092,939 A | 3/1992 | Nath et al. .............. 136/251 |
| 5,437,735 A | 8/1995 | Younan et al. .......... 136/251 |
| 5,575,861 A | 11/1996 | Younan et al. .......... 136/251 |
| 5,590,495 A | * 1/1997 | Bressler et al. ......... 52/173.3 |
| 5,968,287 A | 10/1999 | Nath ..................... 136/251 |
| 5,990,414 A | * 11/1999 | Posnansky .............. 136/244 |
| 6,342,669 B1 | * 1/2002 | Sakai et al. ............ 136/244 |
| 6,463,708 B1 | * 10/2002 | Anderson ................ 52/521 |
| 6,525,262 B1 | * 2/2003 | Makita et al. ........... 136/244 |
| 6,534,702 B1 | * 3/2003 | Makita et al. ........... 136/244 |
| 6,546,535 B1 | * 4/2003 | Nagao et al. ............ 716/11 |
| 6,553,729 B1 | * 4/2003 | Nath et al. ............. 51/173.3 |
| 6,729,081 B2 | * 5/2004 | Nath et al. ............. 52/173.3 |
| 2003/0154666 A1 | * 8/2003 | Dinwoodie .............. 52/173.3 |
| 2004/0031518 A1 | * 2/2004 | Plantfeber .............. 136/251 |

FOREIGN PATENT DOCUMENTS

| DE | 4017933 A1 | * 12/1991 |
| JP | 2003-258290 A | * 9/2003 |

* cited by examiner

*Primary Examiner*—Alan Diamond
(74) *Attorney, Agent, or Firm*—Gifford, Krass, Groh, Sprinkle, Anderson & Citkowski, P.C.

(57) ABSTRACT

A photovoltaic roofing system includes front surface electrical connections and can be installed utilizing conventional tools and techniques. The system includes particularly configured photovoltaic power generating roofing shingles which provide for linearly aligned electrical terminals when installed. The system may be used in conjunction with a protective cap which shields the connections.

5 Claims, 2 Drawing Sheets

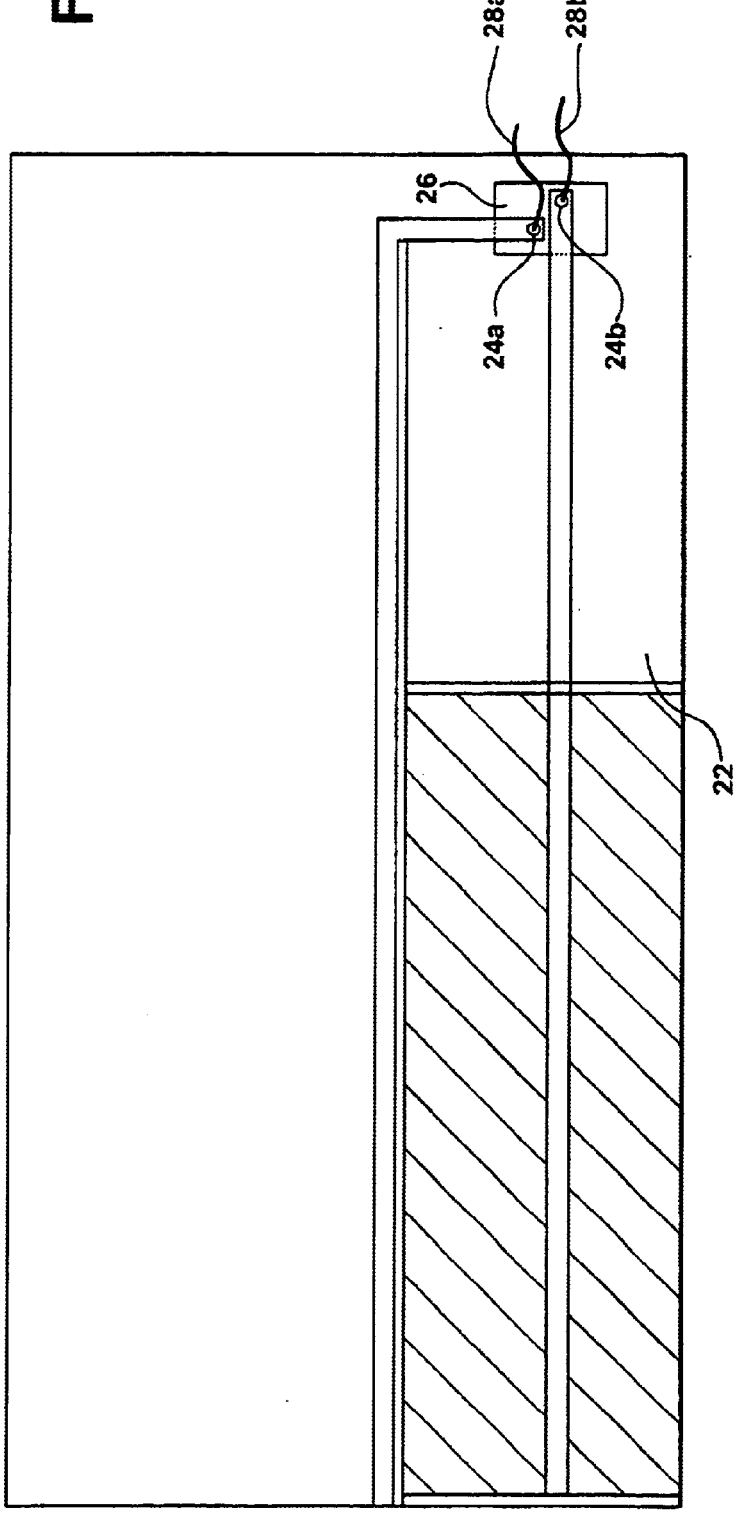
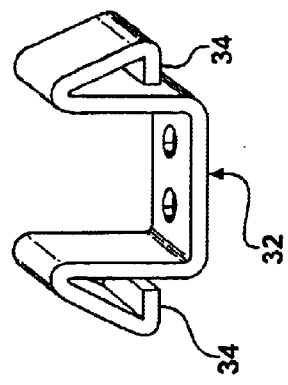
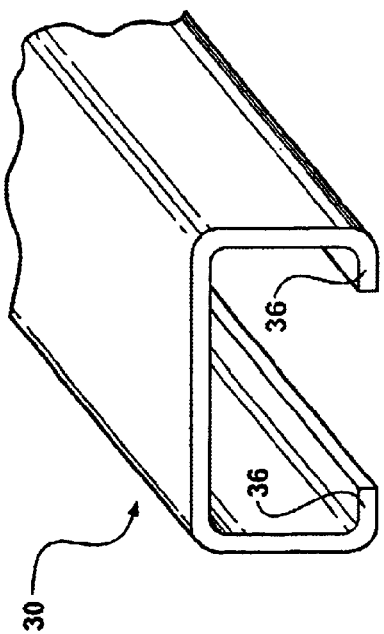

PHOTOVOLTAIC ROOFING STRUCTURE

RELATED APPLICATION

This application claims priority of U.S. Provisional Patent Application Ser. No. 60/348,681 filed Jan. 14, 2002, entitled "Photovoltaic Roofing System".

FIELD OF THE INVENTION

This invention relates to photovoltaic devices, and more particularly to a roofing material which is capable of generating electrical power. Most specifically, the invention relates to an electrical power generating roofing shingle which is compatible with conventional shingles, and which embodies front surface electrical connections.

BACKGROUND OF THE INVENTION

Photovoltaic energy is becoming a very significant source of electrical power. The roofs of building structures are directly exposed to solar radiation, and are particularly well suited for supporting photovoltaic generating devices. In this regard, the prior art has developed various roofing structures and members which are capable of generating photovoltaic power. Many of such prior art structures are cumbersome, expensive, and very difficult to install. Therefore, the prior art has sought methods and devices whereby a photovoltaic generating material may be disposed upon a roofing structure by simple techniques which are preferably compatible with conventional building practices, and in that regard it is desirable to have photovoltaic roofing material which is as much like conventional roofing material as possible. The photovoltaic portion of the roofing material should be self contained to a large degree and the roofing material should be capable of being installed by conventional techniques.

U.S. Pat. Nos. 5,437,735 and 5,575,861 both disclose photovoltaic shingle structures which are lightweight, flexible, and compatible with standard building structures, materials and practices. The disclosure of these two patents is incorporated herein by reference, and all materials, methods and terms used herein shall be defined and interpreted in accord with the disclosure of those two patents, to the extent that such terms are not inconsistent therewith. While the materials and methods of the foregoing patents have been successfully utilized in a large number of building structures, use of those materials generally requires electrical leads to pass through a roof deck, or to pass under the shingle structures. Such "backside" connections can be difficult to implement, particularly when the shingles are installed onto buildings which do not have full attics or other access to the underside of the roof. In some instances, the through hole connections in the roof are perceived as compromising the integrity of the roof. Also, the backside connection nature of such devices makes them difficult to service or replace.

There is thus a need in the art for photovoltaic roofing members such as shingles which provide for front surface connections and which do not require penetration of a roof deck. Furthermore, such roofing materials should be capable of being installed by roofers without the need for specialized tools or training. As will be described herein, the present invention provides a photovoltaic, electrical generating, roofing structure which meets these requirements.

BRIEF DESCRIPTION OF THE INVENTION

There is disclosed herein a photovoltaic shingle system. The system comprises a plurality of pairs of shingle strips. Each pair includes a first and a second member, and each of said first and second members comprises an elongated strip having a length dimension L greater than a width dimension W. Each member further comprises a photovoltaic generating portion which extends along the length dimension L. The photovoltaic generating portion has a width which is less than the width dimension W. The photovoltaic generating portion includes a plurality of tabs defined thereupon. Each tab has a width which is equal to the width of the photovoltaic generating portion and a length which is less than the length dimension L. Each photovoltaic generating portion further includes at least one photovoltaic device which is operative to generate a flow of electrical current in response to the absorption of illumination thereby. Each photovoltaic generating portion further includes an interconnect region having a width which is equal to the width of the photovoltaic generating portion and a length which is less than the length of any one of the tabs. Each photovoltaic generating portion further includes a pair of electrical terminals which are disposed in the interconnect region and which are in electrical communication with at least one photovoltaic device. The terminals are operative to provide for the collection of the flow of electrical current generated by said at least one photovoltaic device. Each member further includes an overlap portion having a length equal to the length dimension L and a width which is less than the width dimension W. In the shingle system of the present invention, the interconnect region of the first member of said pair of strips is spaced from the first end of said strip by a distance which is different from a distance that the interconnect region of the second member of the pair is spaced from the corresponding end of the second member so that when the first member of the pair and the second member of the pair are disposed in an overlapping relationship such that the first member of the pair overlies the second member of the pair so as to cover at least a portion of the overlap portion of that second member, and when the tabs of the first member of the pair and the tabs of the second member of the pair are disposed in a staggered relationship, the interconnect region of the first member of the pair and the interconnect region of the second member of the pair will be aligned. The shingle system further includes an electrical connector for establishing electrical connection between the electrical terminals of the members of the plurality of pairs of photovoltaic roofing material. The system further includes a protective cap which is configured to overlie the aligned interconnected regions and cover the connector members.

In specific embodiments, the tab members are defined by embossments in the photovoltaic generating portion, whereas in other instances the tab members are defined by notches cut through the photovoltaic generating portion. In specific embodiments, the at least one photovoltaic device comprises a thin film photovoltaic device, such as a photovoltaic device fabricated from a non-crystalline group IV semiconductor material.

BRIEF DESCRIPTION OF THE DRAWINGS

FIG. 2 is a top plan view of a portion of a shingle strip of FIG. 1, better illustrating the interconnect region;

FIG. 3 is a perspective view of a portion of a cap member which may be utilized in the practice of the present invention; and FIG. 4 is a perspective view of a retainer clip which may be employed in the practice of the present invention.

DETAILED DESCRIPTION OF THE INVENTION

The photovoltaic roofing system of the present invention is based upon photovoltaic shingle material which is generally similar to the material described in the '735 and '861 patents; although, it is to be understood that shingles manufactured from photovoltaic materials other than those disclosed herein, as well as roofing materials of other configurations and designs, may likewise be employed in the present invention.

According to the present invention, the photovoltaic roofing system is based upon the use of a plurality of pairs of photovoltaic shingle material. The materials are configured to allow for front surface connection, and the system further includes an electrical interconnect system and a cap member for protecting the integrity of the connections.

Figure 1:
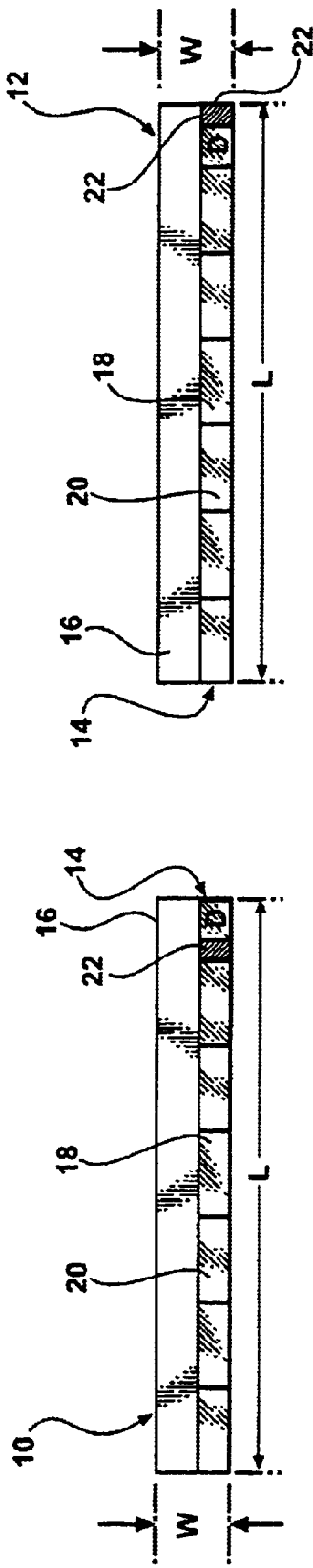
FIG. 1 is a top plan view of one embodiment of roof structure utilizing the photovoltaic shingle material of the present invention.
Figure 1:
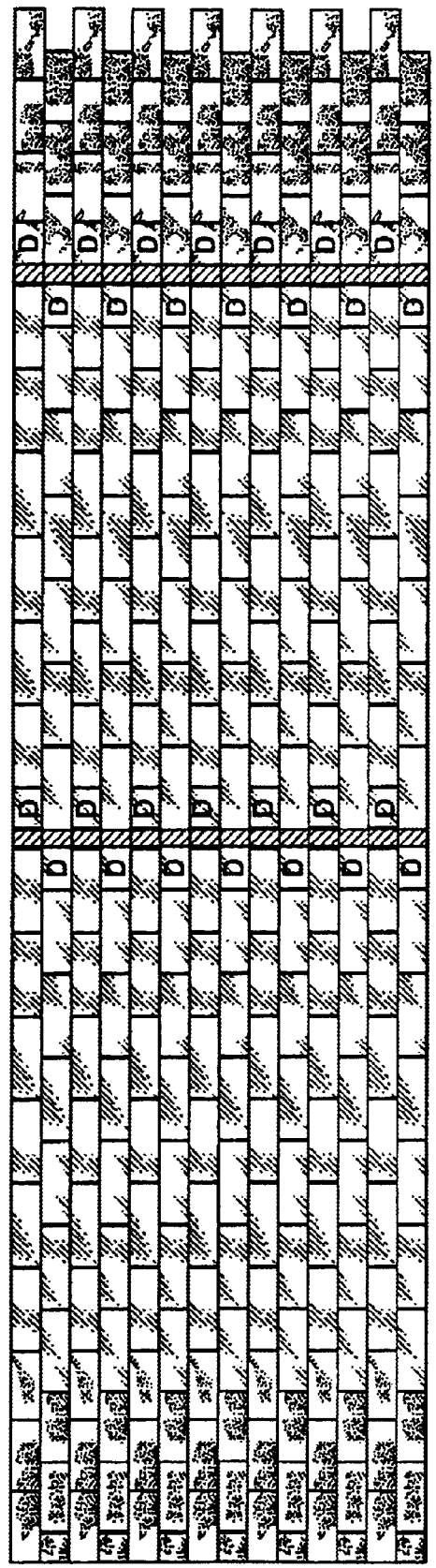

Referring now to FIG. 1, there is shown one embodiment of the present invention. As will be seen, the roofing system is based upon the use of a plurality of pairs of photovoltaic shingle material, and FIG. 1 shows a first member of a pair 10 and a second member of a pair 12. Each of these members is configured as an elongated strip having a length dimension L and a width dimension W. Each includes a photovoltaic generating portion 14 and an overlap portion 16 which is transversely spaced from the photovoltaic generating portion 14. As illustrated, the photovoltaic generating portion 14 is subdivided into a plurality of tabs, for example tabs 18 and 20, which are simulative of conventional shingle tabs. These tabs may be formed by merely embossing portions of the photovoltaic generating region 14, or may be formed by notches cut through the photovoltaic generating region 14. As illustrated, the tabs are all of the same length; however, in some instances, the tabs may vary in length. Generally, the tabs are of a width which is equal to the width of the photovoltaic generating region 14. Each photovoltaic generating region 14 includes at least one photovoltaic device therein. These devices operate to absorb incident light and convert it to electrical energy. The present invention is most preferably implemented in conjunction with thin film photovoltaic devices, such as silicon alloy devices. However, other photovoltaic devices, including single crystal devices and polycrystalline devices, may also be used in the present invention. The majority of the area of the photovoltaic generating portion will have a photovoltaic device or devices disposed thereupon; however, it is to be understood that some sections of the photovoltaic generating portion may be photovoltaically inactive, because of the presence of other structures or materials thereupon.

The photovoltaic generating portion 14 of each member includes an interconnect region 22 thereupon. This interconnect region 22 has a width dimension which is generally coextensive with the width of the photovoltaic generating portion, and it most preferably has a length which is less than the length of any one of the tab members. In certain special cases, there may be a need to make the interconnect region wider than a tab, and such embodiments are within the scope of this invention.

Referring now to FIG. 2, there is shown an enlarged portion of the shingle strip 12 of FIG. 1 better illustrating the interconnect region 22. As will be seen, the interconnect region 22 includes a pair of electrical terminals 24a, 24b which are in electrical communication with the photovoltaic device or devices of the shingle member. These terminals allow for collection of photo generated currents. As further illustrated in FIG. 2, these terminals 24a, 24b are enclosed in a junction box 26 having electrical leads 28a, 28b projecting therefrom. As will be appreciated by those of skill in the art, the junction box and connections may be environmentally sealed by a potting compound or the like. The electrical leads 28a, 28b may be used to establish electrical communication between like shingle structures and/or the power system of a building. In this regard, the electrical leads 28a, 28b may be provided with electrical connectors, and in a preferred embodiment of the invention, environmentally sealable, quick connect devices are disposed on the leads 28.

Referring back to FIG. 1, it will be noted that the interconnect region 22 of the first member 10 of the pair is spaced from a first end of the member 10 by a spacer segment D, and the length of this spacer segment D is approximately one-half the length of a standard tab. The interconnect region of the second member 12 of the pair is disposed at an edge of the strip itself, and is spaced from an adjoining tab by a spacer segment D. It is to be understood that the spacer segments D may be photovoltaically active, or they may be photovoltaically inert.

When the shingle structures of the present invention are in use, they are laid in the manner of conventional shingles so that a first shingle will overlie a substantial area of the overlap portion 16 of another shingle; and they will also be offset so that the tabs are in a staggered relationship, and such a structure is shown in FIG. 1 beneath the depiction of the two strips 10 and 12. It will be seen and appreciated that because of the relative offsets of the interconnect regions 22 in the members of the pair, all of those regions will be linearly aligned when the shingles are installed on a roof structure. As shown in FIG. 1, the photovoltaic generating shingles, indicated by crosshatching, are integrated with conventional shingles, indicated by a dotted texture to form a photovoltaic roof structure, and the linearly aligned interconnect regions provide front surface contacts for establishing electrical connections between the strips and for tapping electrical power, thereby precluding the need to penetrate the roof deck.

In a most preferred embodiment of the present invention, the interconnections between the various shingle strips are protected by a cap member. This cap member may be generally configured as a snap-on member of the type used with conventional batten and seam roofing. FIG. 3 depicts one such cap 30, which is used in connection with a retainer clip 32 shown in FIG. 4. The retainer clip 32 is affixed to the roofing structure, in the interconnect region, by means of screws, nails or the like. The clip 32 includes locking flanges 34 which engage corresponding locking flanges 36 in the cap member 30. It will be appreciated that other protective caps or members of other designs may be likewise employed. Also, in some embodiments, the connections may be left uncapped.

As will be seen from above, the present invention provides a photovoltaic roofing structure which is easily integrated with conventional roofing shingles, and can be installed without specialized tools or training.

It is to be understood that the foregoing drawings, discussion and description are illustrative of particular embodiments of the invention; but they are not meant to be limitations upon the practice thereof. It is the following claims, including all equivalents, which define the scope of the invention.

What is claimed is:

1. A photovoltaic shingle system comprising:
   A. a plurality of pairs of shingle strips, each pair including a first and a second member, each of said first and second members comprising an elongated strip having a length dimension L greater than a width dimension W, each member comprising:

i. a photovoltaic generating portion extending along said length dimension L, said photovoltaic generating portion having a width which is less than said width dimension W, said photovoltaic generating portion including:

a plurality of tabs defined thereupon, each tab having a width which is equal to the width of said photovoltaic generating portion, and a length which is less than said length dimension L;

at least one photovoltaic device which is operative to generate a flow of electrical current in response to the absorption of illumination thereby;

an interconnect region defined therein, said interconnect region having a width which is equal to the width of said photovoltaic generating portion, and a length which is less than the length of any one of said tabs;

a pair of electrical terminals which are disposed in said interconnect region and which are in electrical communication with said at least one photovoltaic device, said terminals being operative to provide for the collection of said flow of electrical current generated by said at least one photovoltaic device;

ii. an overlap portion having a length equal to said length dimension L and a width which is less than said width dimension W;

wherein the interconnect region of said first member of said pair of strips is spaced from a first end of said strip by a distance which is different from a distance that the interconnect region of the second member of said pair is spaced from the corresponding end of said second member, whereby when said first member of said pair and said second member of said pair are disposed in an overlapping relationship such that said first member of said pair overlies said second member of said pair so as to cover at least a part of the overlap portion of said second member of said pair, and when the tabs of said first member of said pair, and the tabs of said second member of said pair are disposed in a staggered relationship, the interconnect region of said first member of said pair, and the interconnect region of said second member of said pair will be aligned;

B. an electrical connector for establishing electrical connection between the electrical terminals of said members of said plurality of pairs of shingle strips; and C. a protective cap configured to overlie the aligned interconnect regions and to cover said electrical connector.

2. The photovoltaic roofing system of claim 1, wherein said tabs are defined by embossments in said photovoltaic generating portion.

3. The photovoltaic roofing system of claim 1, wherein said tabs are defined by notches cut through said photovoltaic generating portion.

4. The photovoltaic roofing system of claim 1, further including retainer clips for affixing said cap to a roofing structure.

5. The photovoltaic roofing system of claim 1, wherein said at least one photovoltaic device comprises a thin film photovoltaic device.

* * * * *